United States Patent
Li et al.

(10) Patent No.: US 11,355,736 B2
(45) Date of Patent: Jun. 7, 2022

(54) LIGHT-EMITTING APPARATUS, A METHOD OF MAKING, AND A DISPLAY PANEL

(71) Applicants: Chengdu BOE Optoelectronics Technology Co., Ltd., Chengdu (CN); BOE Technology Group Co., Ltd., Beijing (CN)

(72) Inventors: Xing Li, Beijing (CN); Hai Zheng, Beijing (CN); Weige Wei, Beijing (CN); Yize Liu, Beijing (CN); Haibo Song, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 52 days.

(21) Appl. No.: 16/634,328

(22) PCT Filed: Jun. 20, 2019

(86) PCT No.: PCT/CN2019/092087
§ 371 (c)(1),
(2) Date: Jan. 27, 2020

(87) PCT Pub. No.: WO2020/140398
PCT Pub. Date: Jul. 9, 2020

(65) Prior Publication Data
US 2021/0083230 A1    Mar. 18, 2021

(30) Foreign Application Priority Data
Jan. 3, 2019  (CN) .................... 201910005277.6

(51) Int. Cl.
*H01L 51/52*    (2006.01)
*H01L 27/32*    (2006.01)
*H01L 51/56*    (2006.01)

(52) U.S. Cl.
CPC ...... *H01L 51/5271* (2013.01); *H01L 27/3246* (2013.01); *H01L 51/5218* (2013.01); *H01L 51/56* (2013.01); *H01L 2227/323* (2013.01)

(58) Field of Classification Search
CPC ........... H01L 27/3246; H01L 2227/323; H01L 51/5271; H01L 51/5218; H01L 51/56
(Continued)

(56) References Cited

U.S. PATENT DOCUMENTS

2009/0251047 A1    10/2009  Lee et al.
2010/0327297 A1*   12/2010  Yoshida ............. H01L 27/3258
                                                                    257/89
(Continued)

FOREIGN PATENT DOCUMENTS

CN    103311265 A    9/2013
CN    104362257 A    2/2015
(Continued)

OTHER PUBLICATIONS

OA1 in CN201910005277.6.
ISR and WO in PCT/CN2019/092087.

*Primary Examiner* — Dzung Tran
(74) *Attorney, Agent, or Firm* — IPro, PLLC

(57) ABSTRACT

Disclosed herein is an apparatus comprising: a pixel define layer (PDL) on a support and having a hole therein; a light emitting layer (EML) at least partially within the hole; and a first reflective layer on a sidewall of the hole and configured to reflect light emitted by the EML. Also disclosed herein is a display panel and a system comprising a plurality of the apparatus. Further disclosed herein is a method of making the apparatus.

15 Claims, 2 Drawing Sheets

(58) Field of Classification Search
USPC .......................................................... 257/72
See application file for complete search history.

(56) References Cited

U.S. PATENT DOCUMENTS

| | | | | |
|---|---|---|---|---|
| 2013/0001603 A1* | 1/2013 | Lim | .................... | H01L 51/5209 |
| | | | | 257/88 |
| 2014/0291648 A1* | 10/2014 | Yamazaki | .............. | H01L 51/525 |
| | | | | 257/40 |
| 2014/0353630 A1* | 12/2014 | Baek | ..................... | H01L 51/525 |
| | | | | 257/40 |
| 2015/0001474 A1* | 1/2015 | Park | .................... | H01L 51/5271 |
| | | | | 257/40 |
| 2016/0190217 A1* | 6/2016 | Park | .................... | H01L 27/3246 |
| | | | | 257/40 |
| 2018/0166648 A1 | 6/2018 | Dai et al. | | |
| 2018/0331325 A1 | 11/2018 | Zhang | | |
| 2019/0131563 A1 | 5/2019 | Liu et al. | | |

FOREIGN PATENT DOCUMENTS

| | | | |
|---|---|---|---|
| CN | 105870154 | A | 8/2016 |
| CN | 106783928 | A | 5/2017 |
| CN | 106941113 | A | 7/2017 |
| CN | 107863449 | A | 3/2018 |
| CN | 109742107 | A | 5/2019 |
| WO | 2020140398 | A1 | 7/2020 |

\* cited by examiner

LIGHT-EMITTING APPARATUS, A METHOD OF MAKING, AND A DISPLAY PANEL

TECHNICAL FIELD

The disclosure herein relates to the technical field of display, particularly relates to a light-emitting apparatus, a method for making the apparatus, and a display panel.

BACKGROUND

Flexible display screens based on light-emitting diodes (e.g., Active-Matrix Organic Light emitting Diodes (AMO-LED)) are on the cutting edge of the field of display. They have characteristics such as a broad color gamut such as the NTSC color gamut, low power consumption, lightness, thinness, flexibility, etc. They gradually become the current mainstream display devices. Although there have been technical accumulation and performance improvement for many years, there still exist some deficiencies, such as:
1. Only 20-40% of the light emitted by a layer is used for displaying with most of the light dissipates inside thereby wasting a large amount of light energy;
2. Due to the limit of blue light emitting materials, the brightness of blue light is relatively low; driving voltage is usually increased to enhance the brightness of blue light, which shortens the lifespan of the blue light emitting materials and leads to a yellow tint as the display screens age.

SUMMARY

Disclosed herein is an apparatus comprising: a pixel define layer (PDL) on a support and having a hole therein; a light emitting layer (EML) at least partially within the hole; and a first reflective layer on a sidewall of the hole and configured to reflect light emitted by the EML.

According to an embodiment, at least a portion of the EML is within a thickness of the PDL.

According to an embodiment, the first reflective layer is a portion of an anode configured to provide electrical power to the EML.

According to an embodiment, the apparatus further comprises a second reflective layer on a bottom of the hole and configured to reflect the light emitted by the EML.

According to an embodiment, the second reflective layer is a portion of an anode configured to provide electrical power to the EML.

According to an embodiment, the second reflective layer and the first reflective layer have different materials.

According to an embodiment, the second reflective layer is directly connected to the first reflective layer.

According to an embodiment, the apparatus further comprises a thin-film transistor (TFT). The second reflective layer is electrically connected to the TFT through the first reflective layer.

According to an embodiment, the apparatus further comprises a thin-film transistor (TFT). The first reflective layer is electrically connected to the TFT through the second reflective layer.

According to an embodiment, the apparatus further comprises a thin-film transistor (TFT), and a barrier wall structure that defines another hole in the PDL. The first reflective layer is electrically connected to the TFT through the other hole.

According to an embodiment, the second reflective layer extends between the PDL and the support.

According to an embodiment, the apparatus further comprises a hole-injection layer (HIL) and a hole-transport layer (HTL) between the EML and a combination of the first reflective layer and the second reflective layer.

According to an embodiment, an opening of the hole is larger in area than a bottom of the hole.

According to an embodiment, a sidewall angle of the sidewall measured outside of the hole is less than 90 degrees.

According to an embodiment, the hole has a circular, oval or polygonal cross-sectional shape.

According to an embodiment, a projection of the EML onto the sidewall at least partially overlaps a projection of the first reflective layer onto the sidewall.

According to an embodiment, the PDL comprises a first layer and a second layer. The first reflective layer extends between the first layer and the second layer.

Disclosed herein is a system comprising any one of the above apparatus. The system is an e-book reader, a laptop computer, a display panel, a computer monitor, a mobile phone, a tablet computer, a television, a display screen, a digital photo frame, or a portable GPS system.

Disclosed herein is a method comprising: forming a first reflective layer on a sidewall of a hole in a pixel define layer (PDL) on a support; forming a light emitting layer (EML) at least partially within the hole. The first reflective layer is configured to reflect light emitted by the EML.

According to an embodiment, at least a portion of the EML is within a thickness of the PDL.

According to an embodiment, the first reflective layer is a portion of an anode configured to provide electrical power to the EML.

According to an embodiment, forming the first reflective layer comprises electrically connecting the first reflective layer to a thin-film transistor (TFT).

According to an embodiment, the method further comprises forming a second reflective layer. The second reflective layer is on a bottom of the hole. The second reflective layer is configured to reflect the light emitted by the EML.

According to an embodiment, forming the second reflective layer comprises electrically connecting the first reflective layer to a thin-film transistor (TFT).

According to an embodiment, forming the first reflective layer and forming the second reflective layer are during the same period.

According to an embodiment, the second reflective layer extends between the PDL and the support.

DETAILED DESCRIPTION

Figure 1:
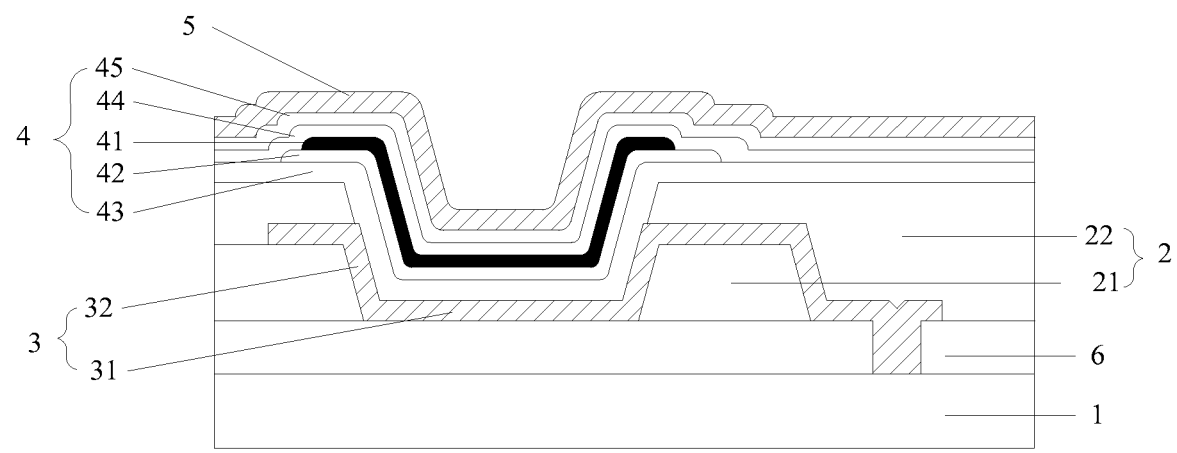
FIG. 1 schematically shows a structural diagram of an apparatus, according to an embodiment.
Figure 2:
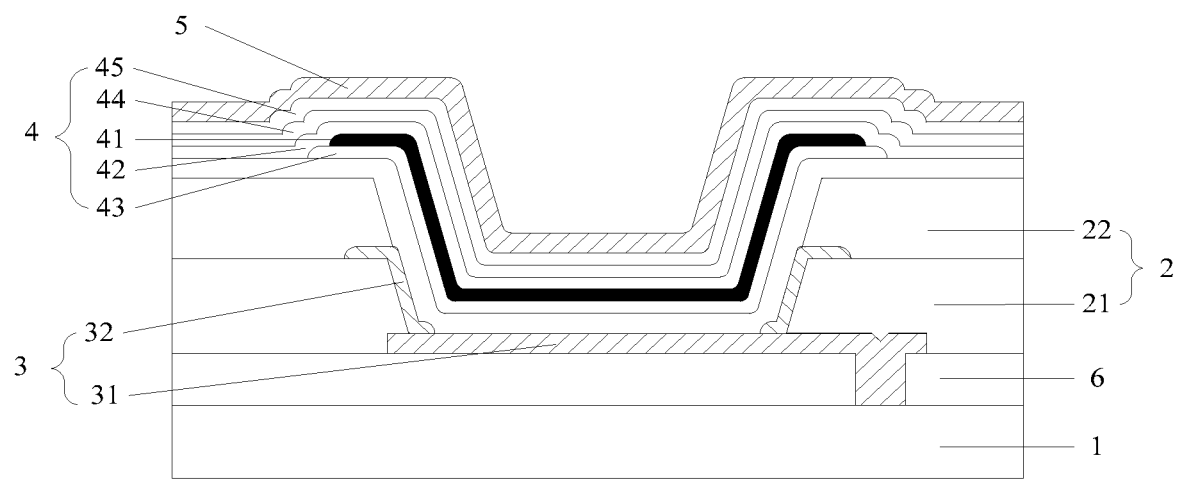
FIG. 2 schematically shows a structural diagram of an apparatus according to an embodiment.

As schematically shown in FIG. 1 and FIG. 2, an apparatus according comprises a pixel define layer (PDL) 2 on a support 1. The PDL 2 comprises a hole 91 therein. The apparatus has a light emitting layer (EML) 41 at least partially in the hole 91. The apparatus has a reflective layer 31 on a sidewall of the hole 91. The reflective layer 31 is configured to reflect light emitted by the EML 41. In an example, at least a portion of the EML 41 is within a thickness of the PDL 2. The thickness is measured in a direction perpendicular to the support 1. The reflective layer 31 may be a portion of an anode 3. The anode 3 may be configured to electrically power the EML 41 (e.g., causing an electric current to flow through the EML 41, thereby causing light emission from the EML 41).

The apparatus may further include a reflective layer 32 on the bottom of the hole 91 and the reflective layer 32 is also configured to reflect light emitted by the EML 41. The reflective layer 32 may laterally (i.e., parallel to the support 1) extend between the PDL 2 and the support 1. The reflective layer 32 may also be a portion of the anode 3. The reflective layer 32 may or may not have the same material as the reflective layer 31. The reflective layer 32 may or may not be directedly connected to the reflective layer 31.

The apparatus may further include a thin-film transistor (TFT), for example, in the support 1 or in another layer on a side of the support opposite to the EML 41. The reflective layer 32 may be electrically connected to the TFT through the reflective layer 31. The reflective layer 31 may be electrically connected to the TFT through the reflective layer 32. The apparatus may have a barrier wall structure 93 that defines another hole 92 in the PDL 2.

The apparatus may include a hole-injection layer (HIL) 43 and a hole-transport layer (HTL) 42 between the EML 41 and a combination of the reflective layer 31 and the reflective layer 32.

In an example, an opening of the hole 91 is larger in area than a bottom of the hole 91. The sidewall angle of the sidewall measured outside of the hole 91 may be less than 90 degrees. The hole 91 may have a circular, oval or polygonal cross-sectional shape.

In an example, a projection of the EML 41 onto the sidewall at least partially overlaps a projection of the reflective layer 31 onto the sidewall.

In an example, the PDL 2 has two layers (e.g., first PDL 21 and second PDL 22), with the reflective layer 31 extending between the layers.

FIG. 1 schematically shows the apparatus according to an embodiment. In this embodiment, the apparatus includes an electron-transport layer (ETL) 44 and an electron-injection layer (EIL) 45. The EML 41, the HTL 42, the HIL 43, the ETL 44 and the EIL 45 constitute a light emitting function layer 4, which is at least partially in the hole 91. The reflective layer 31 and the reflective layer 32 are parts of the anode 3 and thus may be respectively referred to as the first anode 31 and the second anode 32. The first anode 31 at least covers a bottom of the hole 91. The second anode 32 at least covers part of a sidewall of the hole 91, and is connected with the first anode 31 at the bottom of the hole 91. Here, the material of the second anode 32 is a reflective material that is suitable to reflect light emitted from the EML 41.

Reflection of the light emitted from the EML 41 by the second anode 32 increases utilization of the light for display and improves the brightness, without increasing the driving voltage or shortening the lifespan of the apparatus. Further, the second anode 32 is located between the PDL 2 and the light emitting function layer 4, and wraps the light emitting function layer 4, which retards water vapor entering the light emitting function layer 4 (i.e., decreases the water vapor transmission rate (WVTR) of the apparatus) and further prolongs the lifespan of the apparatus.

As shown in FIG. 1, the apparatus may further include a cathode layer 5 and a planarization layer 6. The cathode layer 5 is located at a side of the light emitting function layer 4 away from the support 1. The planarization layer 6 is located between the PDL 2 and the support 1.

The material of the first anode 31 may be a reflective material that is suitable to reflect the light from the EML 41. The presence of the first anode 31 complements the function of the second anode 32.

The material of the anode 3 (including the first anode 31 and the second anode 32) can be ITO-Ag-ITO, i.e., two ITO (Indium Tin Oxide) layers with a Ag metal film in between.

As shown in FIG. 1, the PDL 2 may form the barrier wall structure 93 at the periphery of the hole 91. The second anode 32 at least covers a part of a sidewall of the barrier wall structure 93 that faces the hole 91, and is connected with a TFT (not shown) at a side of the barrier wall structure 93 that is away from the hole 91. The first anode 31 and the second anode 32 may be formed with the same exposure and deposition procedure.

In this embodiment, the PDL 2 may include multiple layers such as the first PDL 21 and the second PDL 22. Here, the first PDL 21 is closer to the support 1 than the second PDL 22. For example, the first PDL 21 is formed before the anode 3, and the anode 3 is formed before the second PDL 22. The PDL 2 having multiple layers allows spatial variation of the distance from the anode 3 to the cathode layer 5, setting the sidewall angle of the hole 91 of the PDL 2, and reduction of the effect of the parasitic capacitance between the cathode layer 5 and the anode 3 in non-light emitting regions.

It should be noted that the PDL 2 can alternatively consist of a single layer.

In an example, the orthographic projection of the light emitting function layer 4 onto the sidewall of the PDL 2 partially overlaps the orthographic projection of the second anode 32 onto the sidewall of the PDL 2.

The sidewall angle of the hole 91 may be between 0 and 90 degrees. Adjusting the sidewall angle can change the angle of emergence of the light from the EML 41 and improve display brightness of the apparatus.

The cross-sectional shape of the hole 91 in a direction parallel to the support 1 can be circular, oval, polygonal or any other suitable shape.

FIG. 2 schematically shows the apparatus according to an embodiment. In this embodiment, the first anode 31 extends between the PDL 2 and the support 1, and is connected with a TFT (not shown). For example, the first anode 31, the first PDL 21, the second anode 32 and the second PDL 22 may be sequentially made.

In this embodiment, there is not a barrier wall structure formed at the periphery of the hole 91. The first anode 31 and the second anode 32 are not arranged on a same layer.

The material of the first anode 31 may be ITO-Ag-ITO; the material of the second anode 32 may be different, such as a metal or a non-metal material having high reflectivity, which minimizes the effect of the second anode 32 on the EML 41 at the sidewall near the opening of the hole 91. The material of the first anode 31 and the material of the second anode 32 may alternatively be the same, for example, ITO-Ag-ITO.

The apparatus of this embodiment may otherwise be the same as the apparatus of shown in FIG. 1. The first anode 31 and the second anode 32 can be formed in the same exposure and deposition procedure or formed in different exposure and deposition procedures. The presence of the barrier wall structure 93 in the apparatus in FIG. 1 leads to greater footprint than the apparatus in FIG. 2. Therefore, the apparatus in FIG. 2 is more suitable for high-resolution displays.

A display panel according to an embodiment includes a plurality of the apparatuses of FIG. 1, FIG. 2, or a combination thereof.

A system may include any of the apparatuses described herein. The system may be an e-book reader, a laptop computer, a display panel, a computer monitor, a mobile phone, a tablet computer, a television, a display screen, a digital photo frame, or a portable GPS system.

A method of making any of the apparatuses described herein may include: forming the reflective layer 31 on the sidewall of the hole 91 and forming the EML 41 at least partially within the hole 91. Forming the reflective layer 31 may include electrically connecting the reflective layer 31 to a TFT. The method may further include forming the reflective layer 32 on the bottom of the hole 91. Forming the reflective layer 32 may include electrically connecting the reflective layer 32 to a TFT.

A method according to an embodiment, for making the apparatus of FIG. 1, includes the following steps:

Step 101: through a patterning process, forming the first PDL 21 comprising the hole 91 and the hole 92 on the support 1, with the barrier wall structure 93 separating the hole 91 and the hole 92. Before step 101, the planarization layer 6 may be formed on the support 1 through a patterning process. The planarization layer 6 may include a through-hole.

Step 102: through a patterning process, forming the second anode 32 on the first PDL 21. The second anode 32 at least covers part of the sidewall of the hole 91. The first anode 31 may be formed with the second anode 32. The first anode 31 is electrically connected to a TFT through the second anode 32, for example, through the through-hole in the planarization layer 6.

Step 103: through a patterning process, forming the second PDL 22. In an example, at the hole 91, the second anode 32 only covers the first PDL 21 but not the second PDL 22. The first PDL 21 and the second PDL 22 may be formed by an ink jet process Step 104: forming the light emitting function layer 4. In an example, an ink jet process can be used for sequentially forming the HIL 43, the HTL 42, the EML 41, the ETL 44 and the EIL 45.

The method may further include:

Step 105: through a patterning process, forming the cathode layer 5.

A method according to an embodiment, for making the apparatus of FIG. 2, includes the following steps:

Step 201: through a patterning process, forming the first anode 31 on the support 1. Before step 201, the planarization layer 6 may be formed on the support 1 through a patterning process. The planarization layer 6 may include a through-hole. The first anode 31 is connected with a TFT via the through-hole.

Step 202: through a patterning process, forming the first PDL 21 comprising the hole 91.

Step 203: through a patterning process, forming the second anode 32 on the first PDL 21. The second anode 32 at least covers part of the sidewall of the hole 91. The second anode 32 is connected with the first anode 31 at the bottom of the hole 91. The second anode 32 is electrically connected with TFT through the first anode 31.

Step 204: through a patterning process, forming the second PDL 22. The first PDL 21 and the second PDL 22 may be formed by an ink jet process.

Step 205: forming the light emitting function layer 4. In an example, an ink jet process can be used for sequentially forming the HIL 43, the HTL 42, the EML 41, the ETL 44 and the EIL 45.

The method may further include:

Step 206: through a patterning process, the pattern of cathode layer 5.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. An apparatus comprising:
a pixel define layer (PDL) on a support and having a hole therein;
a light emitting layer (EML) at least partially within the hole;
a first reflective layer on a sidewall of the hole and configured to reflect light emitted by the EML;
a second reflective layer on a bottom of the hole and configured to reflect the light emitted by the EML; and
a thin-film transistor (TFT);
wherein the second reflective layer is electrically connected to the TFT through the first reflective layer;
wherein the PDL comprises a first PDL layer and a second PDL layer and an electrical connection from the first reflective layer to the TFT extends between the first PDL layer and the second PDL layer.

2. The apparatus of claim 1, wherein at least a portion of the EML is within a thickness of the PDL.

3. The apparatus of claim 1, wherein the first reflective layer is a portion of an anode configured to provide electrical power to the EML.

4. The apparatus of claim 1, wherein the second reflective layer is a portion of an anode configured to provide electrical power to the EML.

5. The apparatus of claim 1, wherein the second reflective layer and the first reflective layer have different materials.

6. The apparatus of claim 1, wherein the second reflective layer is directly connected to the first reflective layer.

7. The apparatus of claim 1, further comprising a thin-film transistor (TFT);
wherein the first reflective layer is electrically connected to the TFT through the second reflective layer.

8. The apparatus of claim 1, further comprising a thin-film transistor (TFT), and a barrier wall structure that defines another hole in the PDL;
wherein the first reflective layer is electrically connected to the TFT through the other hole.

9. The apparatus of claim 1, wherein the second reflective layer extends between the PDL and the support.

10. The apparatus of claim 1, further comprising a hole-injection layer (HIL) and a hole-transport layer (HTL) between the EML and a combination of the first reflective layer and the second reflective layer.

11. The apparatus of claim 1, wherein an opening of the hole is larger in area than a bottom of the hole.

12. The apparatus of claim 11, wherein a sidewall angle of the sidewall measured outside of the hole is less than 90 degrees.

13. The apparatus of claim 1, wherein the hole has a circular, oval or polygonal cross-sectional shape.

14. The apparatus of claim 1, wherein a projection of the EML onto the sidewall at least partially overlaps a projection of the first reflective layer onto the sidewall.

15. The apparatus of claim 1, wherein the PDL comprises a first layer and a second layer;

wherein the first reflective layer extends between the first layer and the second layer.

* * * * *